United States Patent
Adusumilli et al.

(10) Patent No.: US 10,833,072 B1
(45) Date of Patent: Nov. 10, 2020

(54) HETEROJUNCTION BIPOLAR TRANSISTORS HAVING BASES WITH DIFFERENT ELEVATIONS

(71) Applicant: GLOBALFOUNDRIES Inc., Grand Cayman (KY)

(72) Inventors: Siva P. Adusumilli, South Burlington, VT (US); Anthony K. Stamper, Williston, VT (US); Mark Levy, Williston, VT (US); Vibhor Jain, Essex Junction, VT (US); John J. Ellis-Monaghan, Grand Isle, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/404,161

(22) Filed: May 6, 2019

(51) Int. Cl.
| | |
|---|---|
| *H01L 27/082* | (2006.01) |
| *H01L 29/737* | (2006.01) |
| *H01L 29/66* | (2006.01) |
| *H01L 29/06* | (2006.01) |
| *H01L 29/08* | (2006.01) |
| *H01L 29/10* | (2006.01) |
| *H01L 21/8222* | (2006.01) |
| *H01L 21/225* | (2006.01) |
| *H01L 21/311* | (2006.01) |

(Continued)

(52) U.S. Cl.
CPC ...... *H01L 27/0823* (2013.01); *H01L 21/2253* (2013.01); *H01L 21/31111* (2013.01); *H01L 21/76229* (2013.01); *H01L 21/8222* (2013.01); *H01L 23/544* (2013.01); *H01L 27/0623* (2013.01); *H01L 29/0649* (2013.01); *H01L 29/0817* (2013.01); *H01L 29/0821* (2013.01); *H01L 29/1004* (2013.01); *H01L 29/66242* (2013.01); *H01L 29/7371* (2013.01); *H01L 2223/5446* (2013.01)

(58) Field of Classification Search
CPC . H01L 2924/13051; H01L 29/737–739; H01L 29/66242; H01L 29/66318; H01L 29/0821–0826; H01L 29/0804–0817; H01L 27/0823; H01L 21/8222; H01L 21/8248
See application file for complete search history.

(56) References Cited

U.S. PATENT DOCUMENTS

| | | |
|---|---|---|
| 5,128,280 A | 7/1992 | Matsumoto et al. |
| 8,415,763 B2 | 4/2013 | Harame et al. |

(Continued)

*Primary Examiner* — Nelson Garces
(74) *Attorney, Agent, or Firm* — Thompson Hine LLP; Francois Pagette

(57) ABSTRACT

Structures for a heterojunction bipolar transistor and methods of fabricating such structures. A hardmask is formed that includes an opening over a first portion of a substrate in a first device region and a shape over a second portion of the substrate in a second device region. An oxidized region in the first portion of the substrate while the shape blocks oxidation of the second portion of the substrate. The oxidized region is subsequently removed from the first portion of the substrate to define a recess. A first base and a first emitter of a first heterojunction bipolar transistor are formed over the first portion of the substrate in the first device region, and a second base and a second emitter of a second heterojunction bipolar transistor are formed in the recess over the second portion of the substrate in the second device region.

14 Claims, 14 Drawing Sheets

(51) Int. Cl.
*H01L 27/06* (2006.01)
*H01L 21/762* (2006.01)
*H01L 23/544* (2006.01)

(56) References Cited

U.S. PATENT DOCUMENTS

2010/0047986 A1* 2/2010 Chen .................... H01L 29/7371
 438/312
2017/0365695 A1* 12/2017 Jain .................... H01L 29/66287
2020/0066886 A1* 2/2020 Obu .................... H01L 29/7371

* cited by examiner

US 10,833,072 B1

HETEROJUNCTION BIPOLAR TRANSISTORS HAVING BASES WITH DIFFERENT ELEVATIONS

BACKGROUND

The invention relates generally to semiconductor device and integrated circuit fabrication and, in particular, to structures for a heterojunction bipolar transistor and methods of fabricating a structure for a heterojunction bipolar transistor.

A bipolar junction transistor is a three-terminal electronic device that includes an emitter, a collector, and an intrinsic base arranged between the emitter and collector. In a PNP bipolar junction transistor, the emitter and collector are composed of p-type semiconductor material, and the intrinsic base is composed of n-type semiconductor material. In an NPN bipolar junction transistor, the emitter and collector are composed of n-type semiconductor material, and the intrinsic base is composed of p-type semiconductor material. A subcollector, which has the same conductivity type as the collector, is arranged beneath the collector and provides a mechanism for contacting the collector. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials have different energy bandgaps, which creates heterojunctions. For example, the collector and/or emitter of a heterojunction bipolar transistor may be constituted by silicon, and the intrinsic base of a heterojunction bipolar transistor may be constituted by a silicon germanium (SiGe) alloy, which is characterized by a narrower band gap than silicon.

Heterojunction bipolar transistors may be formed with different breakdown voltages on the same chip. However, multiple implantations and implantation masks are generally required to provide the different breakdown voltages. Specifically, the different breakdown voltages are achieved by providing different varieties of heterojunction bipolar transistors in which the collectors and/or subcollectors have different implanted dopant levels and, therefore, are characterized by different electrical conductivities.

Improved structures for a heterojunction bipolar transistor and methods of fabricating a structure for a heterojunction bipolar transistor are needed.

SUMMARY

In an embodiment of the invention, a structure includes a first heterojunction bipolar transistor having a first subcollector, a first collector over the first subcollector, a first base over the first collector, and a first emitter over the first base. The device structure further includes a second heterojunction bipolar transistor having a second subcollector, a second collector over the second subcollector, a second base over the second collector, and a second emitter over the second base. The first collector has a first thickness, and the second collector has a second thickness that is greater than the first thickness of the first collector.

In an embodiment of the invention, a method includes forming a hardmask that includes an opening over a first portion of a substrate in a first device region and a shape over a second portion of the substrate in a second device region. The method further includes forming an oxidized region in the first portion of the substrate while the shape blocks oxidation of the second portion of the substrate, removing the oxidized region from the first portion of the substrate to define a recess, forming a collector of a heterojunction bipolar transistor in the recess in the first portion of the substrate, and forming a base and an emitter of the heterojunction bipolar transistor over the collector.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
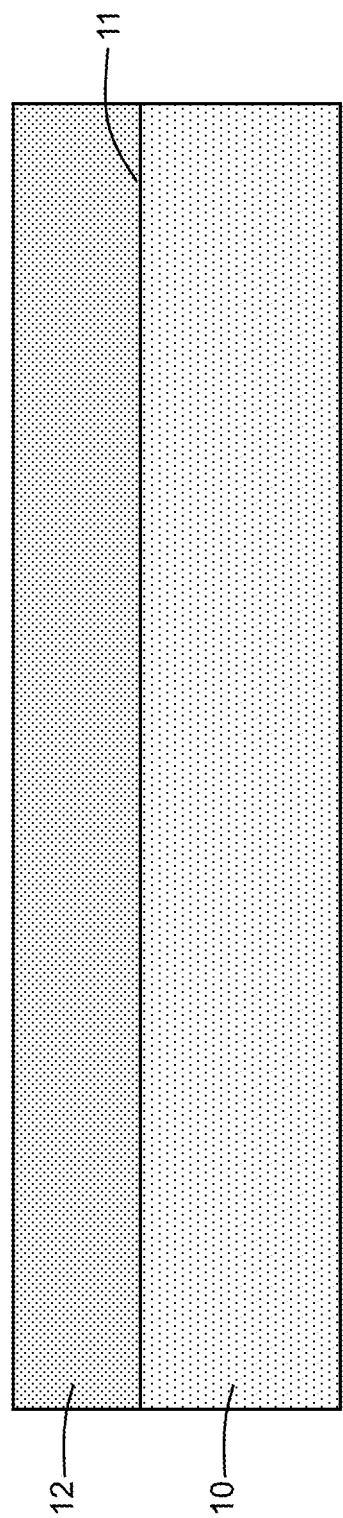
FIGS. 1-8 are cross-sectional views of a device structure at successive fabrication stages of a processing method in accordance with embodiments of the invention.

With reference to FIG. 1 and in accordance with embodiments of the invention, a substrate 10 is composed of a single-crystal semiconductor material suitable for the fabrication of the device structures of an integrated circuit. For example, the substrate 10 may be a bulk semiconductor wafer composed of single-crystal silicon. A hardmask 12 is applied over a top surface 11 of the substrate 10. The hardmask 12 may be composed of a dielectric material, such as silicon dioxide, deposited by chemical vapor deposition. The thickness of the hardmask 12 is selected to protect regions of the substrate 10 during the performance of a subsequent ion implantation process.

Figure 2:
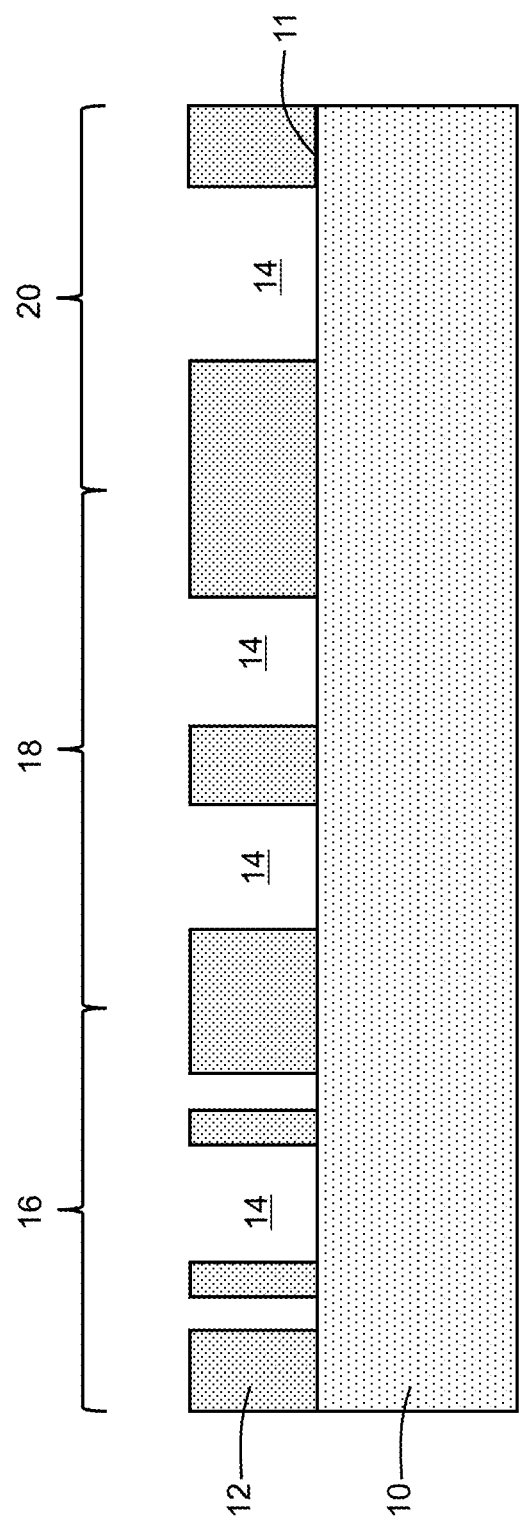

With reference to FIG. 2 in which like reference numerals refer to like features in FIG. 1 and at a subsequent fabrication stage of the processing method, the hardmask 12 is patterned using lithography and etching processes to define openings 14 that locally expose the substrate 10 and shapes of solid material that locally cover areas on the top surface 11 of the substrate 10. The etching process, which may be a reactive ion etching process, may stop on the substrate 10 after the openings 14 penetrate through the hardmask 12. The openings 14 in the hardmask 12 may be arranged within multiple different regions of the substrate 10. Specifically, the openings 14 in the hardmask 12 may be arranged within a device region 16 and within a device region 18, as well as within a kerf region 20 in which an alignment mark is subsequently formed. Different device structures may be subsequently formed in the different device regions 16, 18. The kerf region 20 may be removed by wafer dicing when individual die are separated from the substrate 10 after processing.

Each of the openings 14 in the hardmask 12 within the device region 16 exposes an individual area on the top surface 11 of the substrate 10. The openings 14 in the hardmask 12 within the device region 16 expose a total area on the top surface 11 of the substrate 10 represented by a sum of the individual areas. Similarly, each of the openings 14 in the hardmask 12 within the device region 18 exposes an area on the top surface 11 of the substrate 10. The openings 14 in the hardmask 12 within the device region 18 expose a total area on the top surface 11 of the substrate 10 represented by a sum of the individual areas. In an embodiment, the total area on the top surface 11 exposed by the openings 14 in the hardmask 12 within the device region 16 may be equal, or substantially equal, to the total area on the top surface 11 exposed by the openings 14 in the hardmask 12 within the device region 18.

Figure 3:
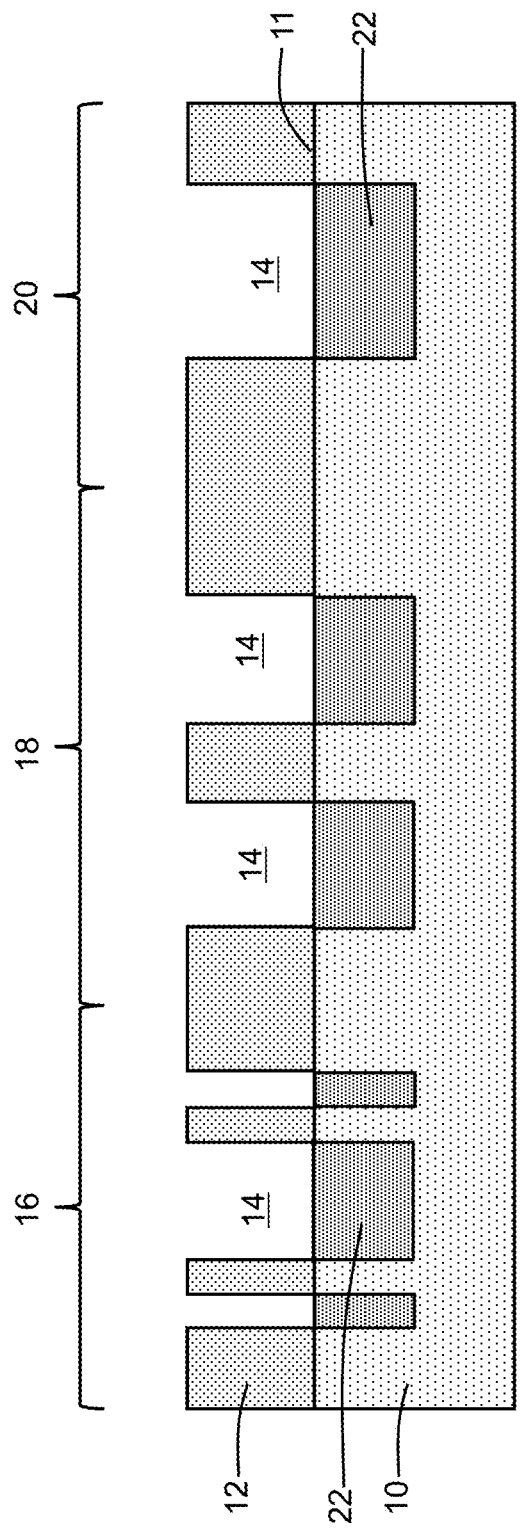

With reference to FIG. 3 in which like reference numerals refer to like features in FIG. 2 and at a subsequent fabrication stage of the processing method, doped regions 22 are formed in the different device regions 16, 18 and the kerf region 20 of the substrate 10 by introducing a dopant into the substrate 10. The dopant may be introduced over a given depth range in the substrate 10 to provide a depth profile characterizing the dopant concentration as a function of depth. In an embodiment, the doped regions 22 may be formed by implanting ions containing the dopant under a given set of implantation conditions (e.g., ion species, dose, kinetic energy, tilt angle) through the openings 14 and into the substrate 10. In an embodiment, the doped regions 22 may contain a concentration of an n-type dopant (e.g., phosphorus, arsenic, and/or antimony) that provides n-type conductivity. The ions used to form the doped regions 22 may be generated from a suitable source gas and implanted into the substrate 10 with the given set of implantation conditions using an ion implantation tool. The given set of implantation conditions may be selected to tune the electrical and physical characteristics (e.g., electrical resistivity and depth profile) of the doped regions 22. The dopant concentration of the doped regions 22 in device region 18 may be greater than the dopant concentration of the doped regions 22 in device region 16 due to, for example, the dimensions of the openings 14 and/or the implantation angle.

The openings 14 in the hardmask 12 define the locations and pattern of the doped regions 22 in the different device regions 16, 18 and kerf region 20. The side edges of each doped region 22 generally coincide in a vertical direction with the inner edges of the corresponding opening 14. In addition, the shapes of the patterned hardmask 12 block the introduction of implanted ions into regions of the substrate 10 arranged between and about the doped regions 22 such that these blocked regions of the substrate 10 are not doped by the implantation and retain their original polarity or conductivity type. The thickness of the shapes of the hardmask 12 may be selected to stop the implanted ions before reaching the substrate 10. The equivalence or substantial equivalence of the total area exposed by the openings 14 within the device region 16 and the total area exposed by the openings 14 within the device region 18 may function to equalize the implanted ion dose in the different device regions 16, 18.

In device region 16 and device region 18, the doped regions 22 are subsequently used to define respective subcollectors of the fabricated device structures. In kerf region 20, the doped region 22 is subsequently used to define an alignment mark.

Figure 4:
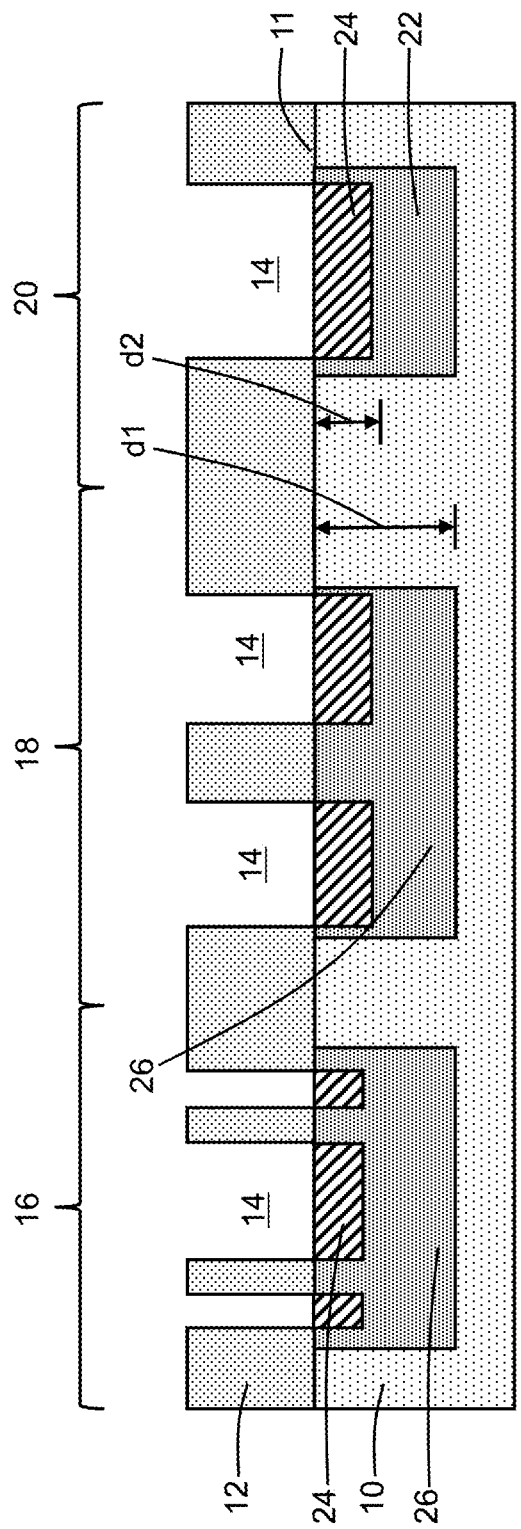

With reference to FIG. 4 in which like reference numerals refer to like features in FIG. 3 and at a subsequent fabrication stage of the processing method, oxidized regions 24 may be formed in the different device regions 16, 18 and the kerf region 20 of the substrate 10 at the locations of the openings 14 in the hardmask 12. The oxidized regions 24 may be composed of silicon dioxide grown with localization by thermal oxidation of the semiconductor material of the substrate 10. Due to the common use of the openings 14 during implantation and oxidation, the oxidized regions 24 are aligned and overlap with the doped regions 22, and respective sections of the doped regions 22 are consumed by the thermal oxidation process. The depth, d2, of the oxidized regions 24 is less than the depth, d1, of the doped regions 22.

The depth of the oxidized regions 24 in the device region 18 may be greater than the depth of the oxidized regions 24 in the device region 16. The depth difference may be the result in an oxidation rate that is affected by differences in dopant concentration between the doped region 22 in device region 18 and the doped region 22 in the device region 16. The shapes of the hardmask 12 block the oxidation of the underlying portions of the substrate 10.

The formation of the oxidized regions 24 may also cause solid-phase diffusion of the dopant of the doped regions 22. In particular, the dopant in the doped regions 22 may diffuse both laterally and to a greater depth into the substrate 10. The doped regions 22 may merge together in the device regions 16, 18 to define respective subcollectors 26. In an embodiment, a separate thermal anneal process may be used to cause the dopant diffusion and merger of the doped regions 22. For example, either before or after thermal oxidation, the substrate 10 may be thermally annealed in a furnace at a temperature of 800° C. to 1150° C. for a time sufficient to prompt a desired level of dopant diffusion.

Figure 5:
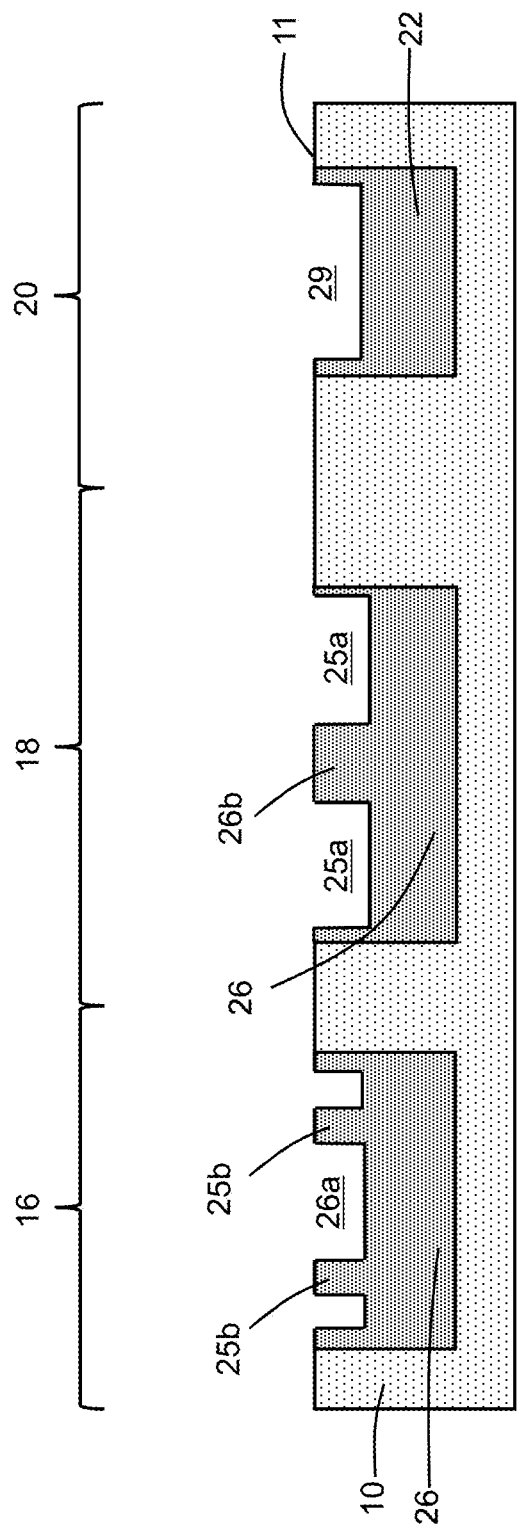

With reference to FIG. 5 in which like reference numerals refer to like features in FIG. 4 and at a subsequent fabrication stage of the processing method, the oxidized regions 24 may be removed selective to the semiconductor material of the subcollectors 26 in device regions 16, 18 and the doped region 22 in kerf region 20. In an embodiment, the oxidized regions 24 are concurrently removed. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. In an embodiment, a wet chemical etching process, such as a wet chemical etching process using buffered or dilute hydrofluoric acid, may be applied to remove the dielectric material of the oxidized regions 24. In an embodiment, the oxidized regions 24 are fully removed to expose surfaces of the subcollectors 26 in the device regions 16, 18 and surfaces of the doped region 22 in the kerf region 20. The hardmask 12 may be concurrently removed by the etching process removing the oxidized regions 24, or by a separate etching process.

The removal of the oxidized regions 24 generates topography in the subcollectors 26 in device regions 16, 18 and the doped region 22 in kerf region 20. The removal of the oxidized regions 24 locally thins the substrate 10. In the kerf region 20, the removal of the oxidized region 24 generates a recess 29.

The subcollector 26 in device region 16 includes a recess 26a that is generated by the removal of one of the oxidized regions 24 and that includes a top surface that is recessed relative to the original top surface 11 of the substrate 10 in the device region 16. The recess 26a is surrounded by mesas 25b having respective top surfaces coinciding with the top surface 11 of the substrate 10 in the device region 16. The subcollector 26 in device region 18 includes a mesa 26b that is generated by the removal of adjacent oxidized regions 24 and that includes a top surface that coincides with the top surface 11 of the substrate 10 in the device region 16. The mesa 26b is surrounded by recesses 25a having respective top surfaces that may be at the same elevation as the top surface of the recess 26a. The mesa 26b is formed at an area masked by an overlying section of the patterned hardmask 12 that was effective to locally block oxidation. The recesses 25a may extend to a greater depth into the substrate 10 than the recess 26a because of the difference in the depth the oxidized regions 24 in the device region 16 and the device region 18. The recess 26a and mesa 26b, which have upper or top surfaces arranged at different elevations, are subsequently used to enable the formation of respective heterojunction bipolar transistors that possess different physical and electrical characteristics.

Figure 6:
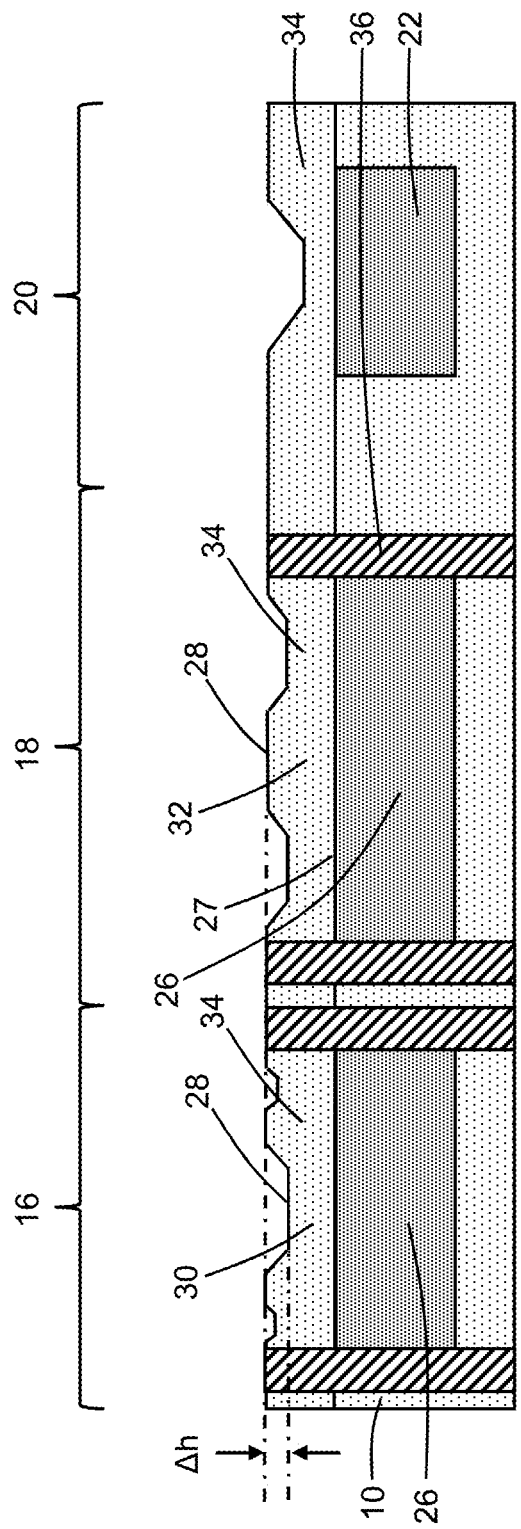

With reference to FIG. 6 in which like reference numerals refer to like features in FIG. 5 and at a subsequent fabrication stage of the processing method, an epitaxial layer 34 is formed over the subcollectors 26 in device regions 16, 18 and the doped region 22 in kerf region 20. The epitaxial layer 34 may be composed of a single-crystal semiconductor material, such as single-crystal silicon. In an embodiment, the epitaxial layer 34 may contain a concentration of an n-type dopant (e.g., phosphorus, arsenic, and/or antimony) that provides n-type conductivity, and may be doped during epitaxial growth. The epitaxial layer 34 may be formed using an epitaxial growth process, and may include single-crystal semiconductor material epitaxially grown on the subcollectors 26 in device regions 16, 18 and the doped region 22 in kerf region 20.

The underlying topography of the subcollectors 26 in device regions 16, 18 and the doped region 22 in kerf region 20, which was generated by the removal of the oxidized regions 24, also generates matching topography in the epitaxial layer 34. During epitaxial growth, the topography of the underlying subcollectors 26 in device regions 16, 18, and the raised regions or mesas of the subcollectors 26 in particular, is subsumed into the epitaxial layer 34 such that the subcollectors 26 and the epitaxial layer 34 in device regions 16, 18 have respective interfaces 27 that are planar or substantially planar. The epitaxial layer 34 includes a portion 30 that is arranged within device region 16 and that is correlated in position with the recess 26a in the subcollector 26. The epitaxial layer 34 includes a portion 32 that is arranged within device region 18 and that is correlated in position with the mesa 26b in the subcollector 26. The top surface 28 of the portion 30 of the epitaxial layer 34 in device region 16 and the top surface 28 of the portion 32 of the epitaxial layer 34 in device region 18 have an elevation difference, $\Delta h$. In an embodiment, the value of the elevation difference between the top surface 28 of the different portions 30, 32 of the epitaxial layer 34 may range from 0.025 microns to 0.27 microns.

Deep trench isolation regions 36 are formed in the substrate 10. The deep trench isolation regions 36 may be formed by forming a pattern of trenches in the substrate 10 with lithography and etching processes, filling the trenches with a dielectric material, planarizing with chemical mechanical polishing, and recessing with a de-glaze process. The dielectric material may be composed of an electrical insulator, such as silicon dioxide, deposited by chemical vapor deposition. The deep trench isolation regions 36, which extend in the substrate 10 to a greater depth than the subcollectors 26, surround the subcollectors 26 in each of the device regions 16, 18. Alternatively, the deep trench isolation regions 36 may be formed later in the process flow after silicidation preceding contact formation.

Figure 7:
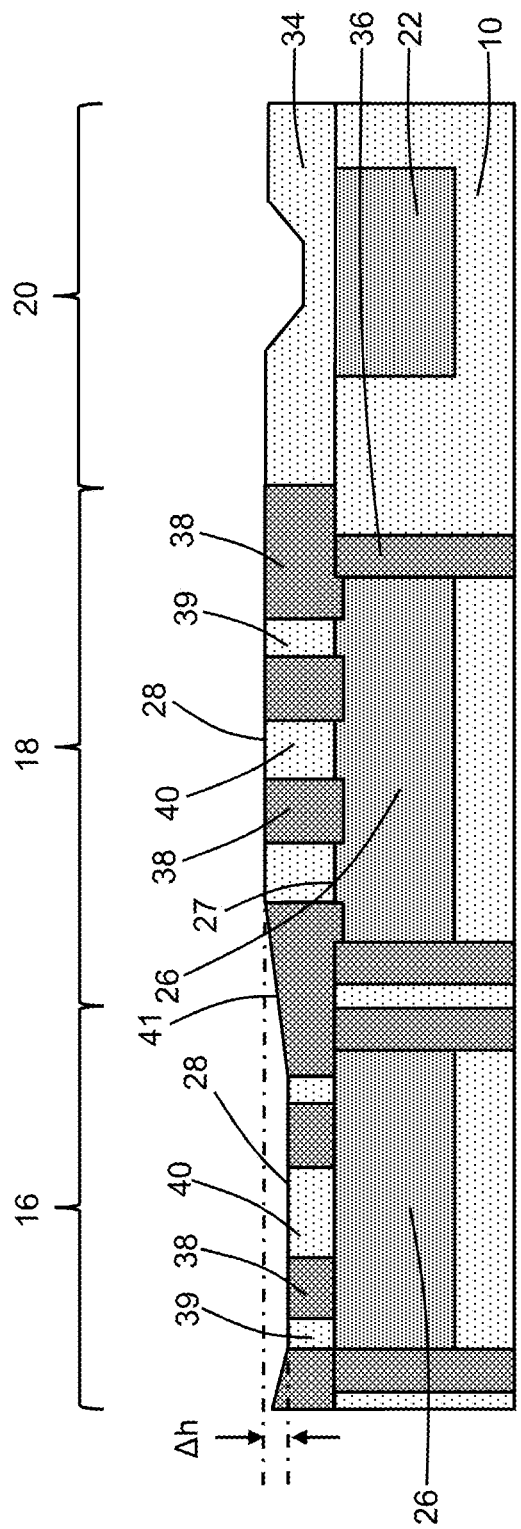

With reference to FIG. 7 in which like reference numerals refer to like features in FIG. 6 and at a subsequent fabrication stage of the processing method, shallow trench isolation regions 38 are formed in the epitaxial layer 34 within the device regions 16, 18. The shallow trench isolation regions 38 may be formed by forming a pattern of trenches with lithography and etching processes, filling the trenches with a dielectric material, planarizing with chemical mechanical polishing, and recessing with a de-glaze process. The dielectric material may be composed of an electrical insulator, such as silicon dioxide, deposited by chemical vapor deposition.

The shallow trench isolation regions 38 have a dual-depth construction because the shallow trench isolation regions 38 in the device region 16 are formed in the epitaxial layer 34 at the locations of the mesas 25b (FIG. 5), and the shallow trench isolation regions 38 in the device region 18 are formed in the epitaxial layer 34 at the locations of the recesses 25a (FIG. 5). The consequence is that the shallow trench isolation regions 38 in the device region 18 may be thicker than (i.e., have a greater height than or taller than) the shallow trench isolation regions 38 in the device region 16, and the shallow trench isolation regions 38 in the device region 18 may also extend to a greater depth than the shallow trench isolation regions 38 in the device region 16. In an embodiment, the shallow trench isolation regions 38 in the device region 18 may extend fully through the epitaxial layer 34 and to a shallow depth into the underlying subcollector 26. The shallow trench isolation region 38 at the transition between the device region 16 and the device region 18 may have a sloped top surface 41 as a consequence of being located at the transition between the different thicknesses.

The shallow trench isolation regions 38 surround portions of the epitaxial layer 34 to define respective collectors 40 in the different device regions 16, 18, such that the shallow trench isolation regions 38 surround the respective collectors 40. The electrical conductivity of the collectors 40 may be increased by, for example, the selective implantation of a dopant, such as an n-type dopant. In an embodiment, the thickness of the shallow trench isolation regions 38 in the device region 16 may be substantially equal to the thickness of the collector 40 in the device region 16. In an embodiment, the thickness of the shallow trench isolation regions 38 in the device region 18 may be greater than or equal to the thickness of the collector 40 in the device region 18.

The subcollectors 26 extend laterally beneath the shallow trench isolation regions 38 in order to couple the collectors 40 with respective collector contact regions 39, which are respectively arranged outside of the shallow trench isolation regions 38. The top surfaces of the collectors 40 in the different device regions 16, 18 retain the top surface 28 of the different portions 30, 32 of the epitaxial layer 34. The elevation difference, $\Delta h$, between the portion of the epitaxial layer 34 in device region 16 and the portion of the epitaxial layer 34 in device region 18, as shown in FIG. 6, is preserved and maintained following the formation of the shallow trench isolation regions 38, which results in an equivalent elevation difference between the top surface 28 of the collector 40 in device region 16 and the top surface 28 of the collector 40 in device region 16 after forming the shallow trench isolation regions 38. A width dimension of the collector 40 and/or the shallow trench isolation region 38 in device region 16 may be equal to a width dimension of the collector 40 and/or the shallow trench isolation region 38 in device region 18, or these width dimensions may differ based on the device requirements and/or performance.

Figure 8:
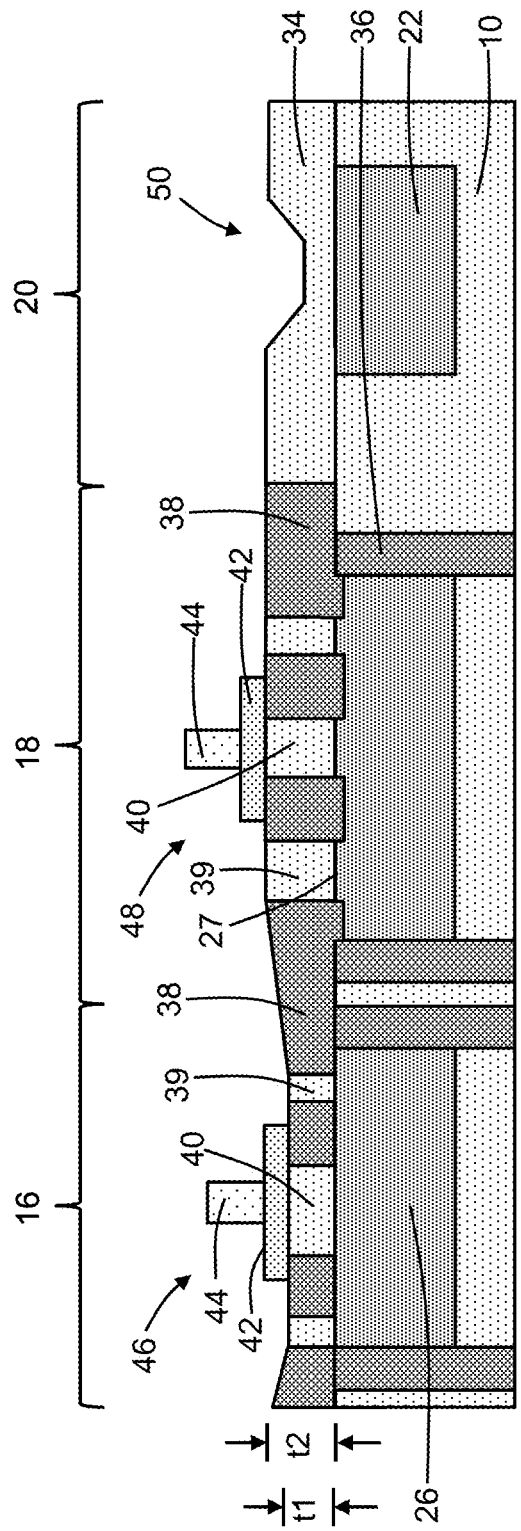

With reference to FIG. 8 in which like reference numerals refer to like features in FIG. 7 and at a subsequent fabrication stage of the processing method, bases 42 are respectively formed over the shallow trench isolation regions 38 and collector 40 in each of the device regions 16, 18. The bases 42 may be composed of a semiconductor material, such as silicon-germanium (SiGe) including silicon (Si) and germanium (Ge) combined in an alloy with the silicon content ranging from 95 atomic percent to 50 atomic percent and the germanium content ranging from 5 atomic percent to 50 atomic percent. The germanium content of the bases 42 may be uniform, or may be graded and/or stepped across its thickness. The bases 42 may be doped with a concentration of a dopant, such as a p-type dopant (e.g., boron and/or indium) to provide p-type conductivity. The bases 42 may be concurrently formed using an epitaxial growth process. The bases 42 may include a layer of single-crystal semiconductor material having portions that are epitaxially grown on each collector 40, and polycrystalline semiconductor material that forms over the shallow trench isolation regions 38 surrounding each collector 40. The crystal structure of the single-crystal semiconductor material of the collectors 40 serves as a crystalline template for the growth of the crystal structure of the single-crystal semiconductor material of the bases 42, whereas the shallow trench isolation regions 38 do not provide any type of crystalline template to support single-crystal growth.

One or more emitters 44 are respectively formed over the base 42 in each of the device regions 16, 18. The one or more emitters 44 may be formed by depositing a highly-doped semiconductor layer that fills windows defined in one or more previously-deposited dielectric layers (not shown), forming an etch mask that masks the deposited layers over the windows, and etching with reactive ion etching to pattern the emitters 44. Each emitter 44 may contain polycrystalline semiconductor material, such as polycrystalline silicon, deposited by chemical vapor deposition, and may be doped during deposition with a concentration of an n-type dopant (e.g., phosphorus and/or arsenic) to provide n-type conductivity.

A device structure 46 for a heterojunction bipolar transistor is formed in device region 16, and a device structure 48 for a different heterojunction bipolar transistor is formed in device region 18. Each of the device structures 46, 48 includes subcollector 26, collector contact regions 39, collector 40, base 42, and emitter 44. The single-crystal semiconductor material of each base 42 may provide an intrinsic base region having junctions with the overlying emitter 44 and the underlying collector 40, and the polycrystalline semiconductor material may provide an extrinsic base region used to contact the intrinsic base region. The different elevations of the top surfaces 28 of the collectors 40 endows the different device structures 46, 48 with different collector-to-base breakdown voltages with emitter open circuited (BVcbo) and different collector-to-emitter breakdown voltages with base open circuited (BVceo). The different breakdown voltages are achieved without adding a mask or additional processing.

Due to the elevation difference between the top surface 28 (FIG. 7) of the collector 40 of device structure 46 and the top surface 28 (FIG. 7) of the collector 40 of device structure 46, the collector 40 of the device structure 46 has a thickness, t1, and the collector 40 of the device structure 48 has a thickness, t2, that is greater than the thickness, t1. Due to this thickness difference, the distance from the upper interface between the base 42 and the top surface 28 of the collector 40 to the lower interface 27 between a bottom surface of the collector 40 and the subcollector 26 is greater for the device structure 48 than for the device structure 46.

The recess 29 in the kerf region 20, resulting from the removal of the oxidized region 24 before growth of the epitaxial layer 34, provides an alignment mark 50 that may be used as a positional reference for wafer alignment in a lithography tool. Specifically, the alignment mark 50 may be used in the lithography tool for aligning the patterns found in different lithography steps used to fabricate the device structures 46, 48.

Middle-of-line (MOL) processing and back-end-of-line (BEOL) processing follow to form an interconnect structure that is connected with the device structures 46, 48. The interconnect structure may include a dielectric layer formed by MOL processing and contacts that coupled the wires in an overlying metallization level formed by BEOL processing. The collector contact regions 39, collectors 40, and emitters 44 of the device structures 46, 48 may be silicided prior to contact formation.

Figure 9:
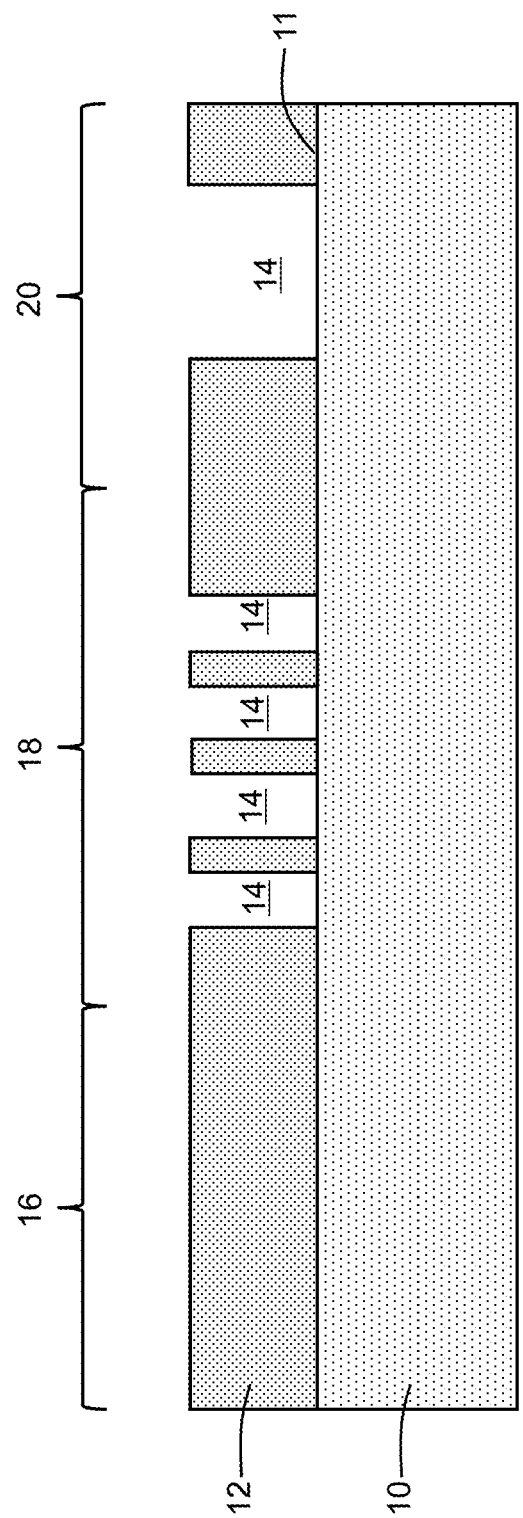
FIGS. 9-14 are cross-sectional views of a device structure at successive fabrication stages of a processing method in accordance with alternative embodiments of the invention.

With reference to FIG. 9 in which like reference numerals refer to like features in FIG. 1 and in accordance with alternative embodiments of the processing method, the photomask used during lithography may be grated in the device region 18 and non-grated in the device region 16. Following the masked etching process previously described in connection with FIG. 2, the result is that the hardmask 12 in the device region 16 is unbroken and intact, and the grated openings 14 only appear in the hardmask 12 within the device region 18. In an embodiment, the openings 14 in the hardmask 12 that are formed within the device region 18 may be periodic.

Figure 10:
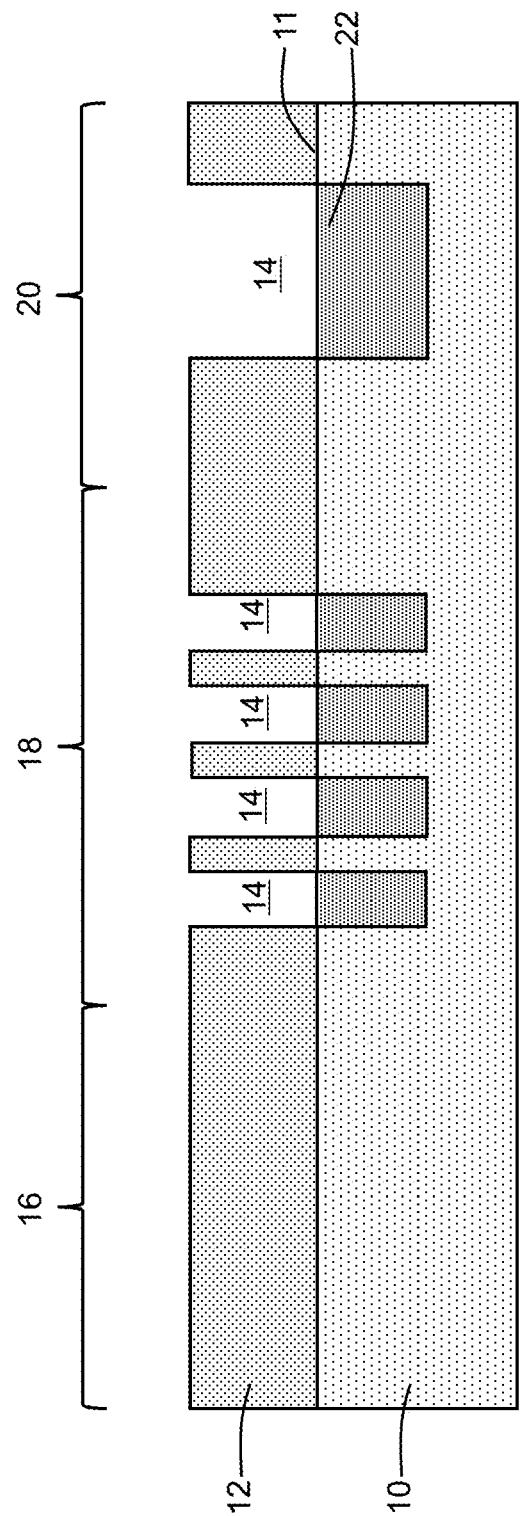

With reference to FIG. 10 in which like reference numerals refer to like features in FIG. 9 and at a subsequent fabrication stage of the processing method, the doped regions 22 are formed in the substrate 10 at the locations of the openings 14 in the hardmask 12 as previously described in connection with FIG. 3. The doped region 22 in the kerf region 20 may contain a higher dopant concentration than the doped regions 22 in the device region 18 due to the larger dimensions for the opening 14 in the kerf region 20. The device region 16 is not doped by the implantation due to the masking by the hardmask 12.

Figure 11:
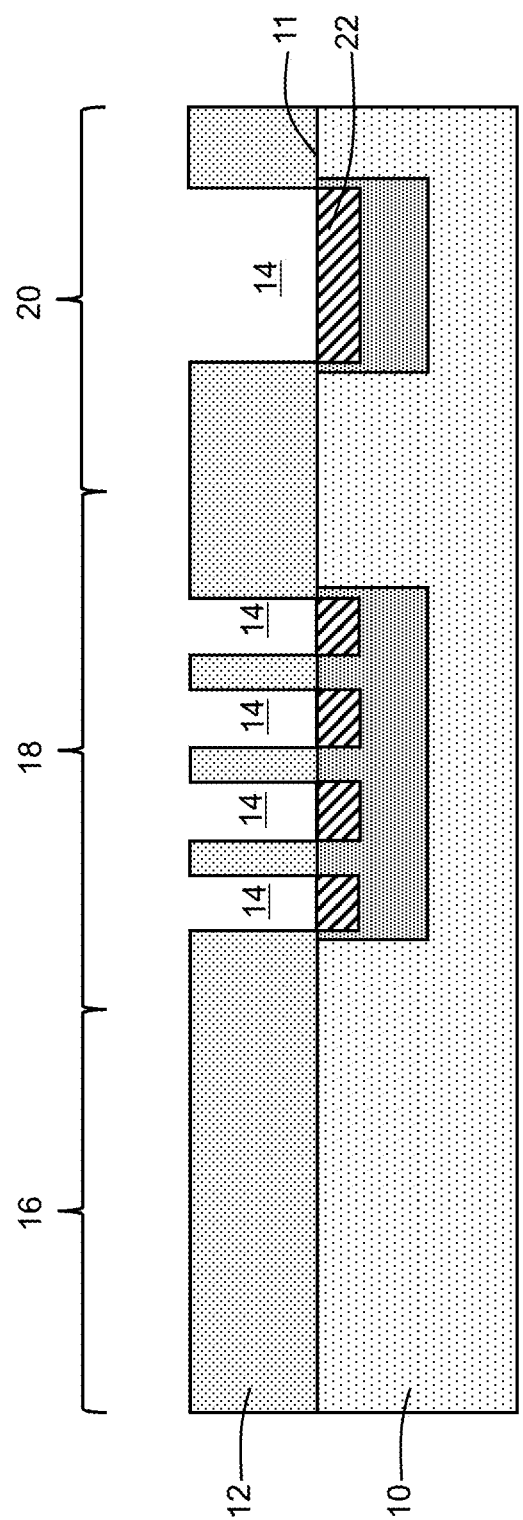

With reference to FIG. 11 in which like reference numerals refer to like features in FIG. 10 and at a subsequent fabrication stage of the processing method, the doped regions 22 are oxidized to form the oxidized regions 24 as previously described in connection with FIG. 4. The oxidized region 24 in the kerf region 20 may exhibit an accelerated growth rate and thickness due to higher doping of the doped region 22 in the kerf region 20 than the doped regions 22 in the device region 18.

Figure 12:
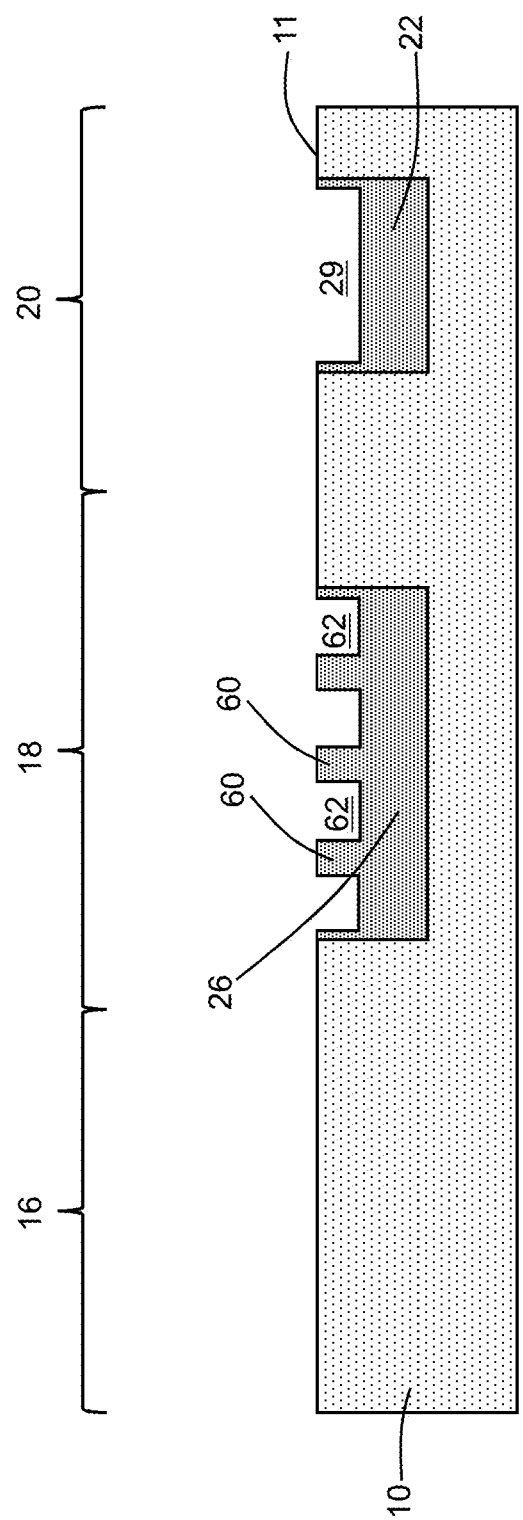

With reference to FIG. 12 in which like reference numerals refer to like features in FIG. 11 and at a subsequent fabrication stage of the processing method, the oxidized regions 24 are removed as previously described in connection with FIG. 5. The removal of the oxidized regions 24 defines mesas 60 and recesses 62 in the device region 18, as well as the recess 29 in the kerf region 20.

Figure 13:
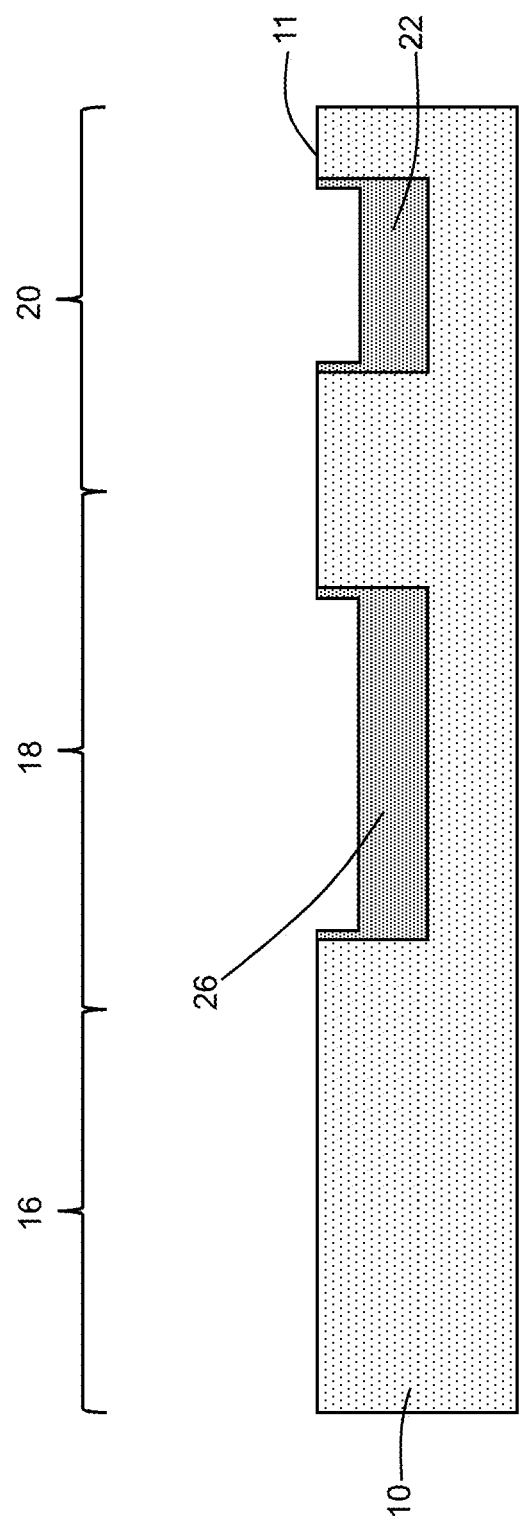

With reference to FIG. 13 in which like reference numerals refer to like features in FIG. 12 and at a subsequent fabrication stage of the processing method, the mesas 60 in the device region 18 may be smoothened by an anneal at a high temperature that causes reflow of the semiconductor material and planarization of the top surface 11 in the device region 18. Alternatively, an epitaxial layer may be grown and then reflowed to planarize the top surface 11 in the device region 18. Alternatively, the mesas 60 may be oxidized with an oxidation process and stripped with an etching process. The smoothening of the mesas 60 in the device region 18 may provide a single recess for which its top surface 11 is planarized and recessed relative to the top surface 11 in device region 16.

Figure 14:
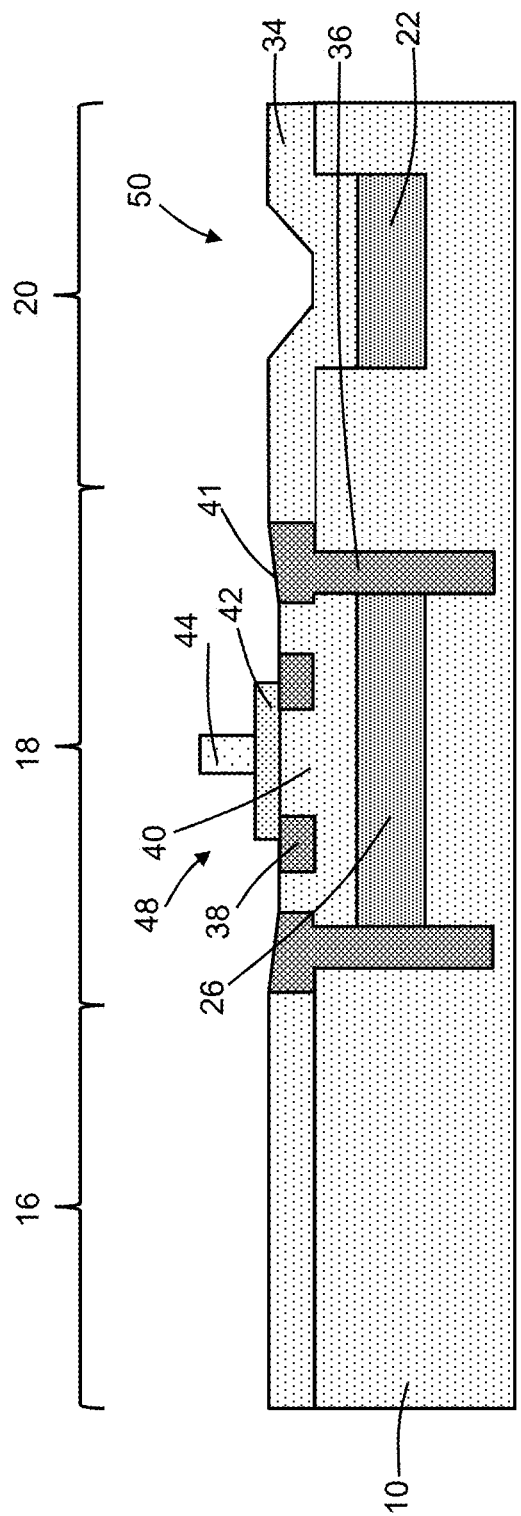

With reference to FIG. 14 in which like reference numerals refer to like features in FIG. 13 and at a subsequent fabrication stage of the processing method, the epitaxial layer 34 is grown as previously described in connection with FIG. 7, and the device structure 48 may be formed in device region 18 as previously described in connection with FIG. 8. The device region 16, which is not modified, may be used to fabricate CMOS device structures.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first heterojunction bipolar transistor including a first subcollector, a first collector over the first subcollector, a first base over the first collector, and a first emitter over the first base, the first collector having a first thickness, and the first heterojunction bipolar transistor formed in a first device region of a substrate;
a second heterojunction bipolar transistor including a second subcollector, a second collector over the second subcollector, a second base over the second collector, and a second emitter over the second base, the second heterojunction bipolar transistor formed in a second device region of the substrate, the second collector having a second thickness that is greater than the first thickness of the first collector; and
a shallow trench isolation region laterally arranged at a transition between the first device region of the substrate and the second device region of the substrate, the shallow trench isolation region having a top surface that is inclined with a slope from the second device region of the substrate to the first device region of the substrate.

2. The structure of claim 1 wherein the first base is separated from the first subcollector by a first distance, and the second base is separated from the second subcollector by a second distance that is greater than the first distance.

3. The structure of claim 2 wherein the first distance is equal to the first thickness of the first collector, and the second distance is equal to the second thickness of the second collector.

4. The structure of claim 1 further comprising:
a deep trench isolation region extending from the shallow trench isolation region into the substrate, the deep trench isolation region arranged to surround the first subcollector.

5. A structure comprising:
a first heterojunction bipolar transistor including a first subcollector, a first collector over the first subcollector, a first base over the first collector, and a first emitter over the first base, the first collector having a first thickness;
a second heterojunction bipolar transistor including a second subcollector, a second collector over the second subcollector, a second base over the second collector, and a second emitter over the second base, the second collector having a second thickness that is greater than the first thickness of the first collector;
a first shallow trench isolation region surrounding the first collector of the first heterojunction bipolar transistor; and
a second shallow trench isolation region surrounding the second collector of the second heterojunction bipolar transistor,
wherein the second shallow trench isolation region is taller than the first shallow trench isolation region.

6. The structure of claim 5 wherein the first shallow trench isolation region has a thickness that is substantially equal to the first thickness, and the second shallow trench isolation region a thickness that is greater than or equal to the second thickness.

7. The structure of claim 5 wherein the first base is separated from the first subcollector by a first distance, and the second base is separated from the second subcollector by a second distance that is greater than the first distance.

8. The structure of claim 7 wherein the first distance is equal to the first thickness of the first collector, and the second distance is equal to the second thickness of the second collector.

9. The structure of claim 5 wherein further comprising:
a first deep trench isolation region extending from the first shallow trench isolation region into a first portion of a substrate beneath the first shallow trench isolation region, the first deep trench isolation region arranged to surround the first subcollector.

10. The structure of claim 9 further comprising:
a second deep trench isolation region extending from the second shallow trench isolation region into a second portion of the substrate beneath the second shallow trench isolation region, the second deep trench isolation region arranged to surround the second subcollector.

11. The structure of claim 1 wherein the first heterojunction bipolar transistor and the second heterojunction bipolar transistor are characterized by different collector-to-base breakdown voltages with emitter open circuited (BVcbo).

12. The structure of claim 1 wherein the first heterojunction bipolar transistor and the second heterojunction bipolar transistor are characterized by different collector-to-emitter breakdown voltages with base open circuited (BVceo).

13. The structure of claim 5 wherein the first heterojunction bipolar transistor and the second heterojunction bipolar transistor are characterized by different collector-to-base breakdown voltages with emitter open circuited (BVcbo).

14. The structure of claim 5 wherein the first heterojunction bipolar transistor and the second heterojunction bipolar transistor are characterized by different collector-to-emitter breakdown voltages with base open circuited (BVceo).

* * * * *